Oct. 7, 1969 L. M. GUGLIOTTI, JR 3,471,794

OPERATIONAL AMPLIFIER HAVING TEMPERATURE COMPENSATION

Filed June 10, 1966

INVENTOR.
LOUIS M. GUGLIOTTI, JR.
BY
Fishman & Van Kirk
ATTORNEYS.

United States Patent Office 3,471,794
Patented Oct. 7, 1969

3,471,794
OPERATIONAL AMPLIFIER HAVING TEMPERATURE COMPENSATION

Louis M. Gugliotti, Jr., Tolland, Conn., assignor to United Aircraft Corporation, East Hartford, Conn., a corporation of Delaware Filed June 10, 1966, Ser. No. 556,627
Int. Cl. H03f 1/32, 3/04
U.S. Cl. 330—23 5 Claims

ABSTRACT OF THE DISCLOSURE

An operational amplifier having an input stage comprised of a temperature compensated differential amplifier which is provided with current drive from a constant current source. The output of the first stage differential amplifier is applied to an intermediate stage temperature compensated buffer-amplifier and the output of the buffer-amplifier is supplied to an output stage comprised of a class A emitter follower which drives a pair of class B emitter followers whereby both positive and negative output signals having the same impedance relationship may be obtained, the output stage being short-circuit protected and the operational amplifier being characterized by low drift and the ability to be driven by high-level input signals.

This invention relates to operational amplifiers. More particularly, this invention is directed to high gain differential amplifiers designed for utilization with a feedback connection between their output and input terminals, the choice of the feedback circuit determining the mathematical operation performed on signals applied to the input terminals. Accordingly, the general objects of this invention are to provide novel apparatus of such character.

Due to the flexibility occasioned by their ability to perform a variety of mathematical operations on signals applied to their input terminals, the use of operational amplifiers is increasing rapidly. While a considerable variety of operational amplifiers have previously been designed, none of the prior art amplifiers have met all the design criteria of or approached the performance which would be desired from the optimum equipment. In order to be applicable to the vast majority of possible uses of these equipments, it is desirable that an operational amplifier be temperature compensated so that there is little if any drift caused by changes in the operating temperature. As is well known, control of temperature induced drift has long been a problem in the design of direct current amplifiers. It is also desirable that an operational amplifier have both a high input impedance and an output impedance which remains constant regardless of the magnitude and polarity of the output signal. While attempts have been made to obtain the aforementioned desirable characteristics, those aimed at eliminating drift and providing a constant output impedance have met with only limited success.

In the prior art, utilization of operational amplifiers has been limited by their inability to be driven by high level input signals. The typical prior art operational amplifier cannot be driven with a signal whose average magnitude is greater than plus or minus two volts (± 2v.). Additionally, the optimum operational amplifier should have very high gain, good common mode rejection, a gain-bandwidth characteristic that provides for stable operation regardless of the closed loop D.C. gain and be capable of delivering a substantial output voltage. It is also desirable that the amplifier be short circuit protected.

The present invention comprises a high gain differential amplifier which meets all of the foregoing design criteria and thus constitutes a significant improvement over the prior art.

It is, therefore, an object of this invention to provide an operational amplifier.

It is another object of this invention to provide a high gain differential amplifier.

It is yet another object of this invention to provide a temperature compensated, high gain differential amplifier.

It is also an object of this invention to provide an operational amplifier characterized by low temperature induced drift.

It is a further object of this invention to provide an operational amplifier having an output impedance which remains constant with variations in the magnitude and polarity of the output signal.

It is still another object of this invention to provide a high gain operational amplifier having a high input impedance and a constant output impedance.

It is another object of this invention to provide a differential amplifier which may be driven by relatively high level input signals.

It is also an object of this invention to provide a temperature compensated operational amplifier having a high input impedance, high gain, and an output impedance which does not vary with the polarity of the output signal.

These and other objects of this invention are accomplished by a novel four stage operational amplifier having, in its input stage, a matched pair of transistors, a constant current source to maintain the collectors of these transistors at a constant current and a pair of matched collector resistors which track each other with changes in temperature. This high gain input stage is followed by a temperature compensated buffer-amplifier. The buffer stage isolates the high gain input stage and the next differential amplifier stage and provides additional temperature compensation. Temperature compensation is achieved in the second stage buffer-amplifier by utilizing, as the buffer portion, a pair of transistors of conductivity type opposite from those employed in the first stage differential amplifier. The output of the second stage buffer-amplifier is applied to a third stage differential amplifier which, again in the interests of temperature compensation, employs a pair of transistors of opposite conductivity type from those employed in the output portion of the preceding stage. The third stage differential amplifier provides a single output which is applied to a novel emitter follower output stage. The output stage comprises a first emitter follower which is biased for class A operation and which provides, through suitably poled diodes, positive and negative signals to respective class B emitter followers. The pair of class B emitter followers are interconnected so as to provide a single output signal.

This invention may be better understood and its numerous advantages will become apparent to those skilled in the art by reference to the accompanying drawing wherein.

Figure 2:
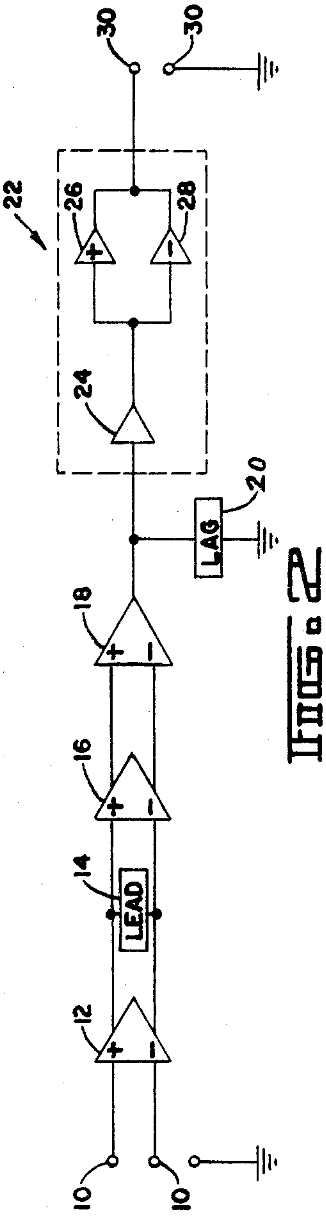
FIGURE 2 is a block diagram of the amplifier of FIGURE 1.

Referring first to FIGURE 2, the amplifier of the present invention comprises a pair of input terminals 10—10 to which opposite polarity input signals may be applied. The signals applied to terminals 10 drive a first stage differential amplifier 12 which utilizes, as will be described in more detail below, a matched pair of NPN type transistors. As will also be described in greater detail below, amplifier 12 is temperature compensated and may be driven with input signals whose magnitude may be as great as 10 volts peak. Amplifier 12 has a gain of approximately 1,000. Connected across the output of amplifier 12 is an RC lead circuit 14.

The output signals from amplifier 12 are applied as inputs to buffer-amplifier 16. Buffer-amplifier 16, which has a gain of approximately 100, comprises two differential amplifiers. The first of these amplifiers comprises a buffer stage which utilizes a pair of PNP type transistors. The buffer stage isolates amplifier 12 from the second differential amplifier in the buffer-amplifier stage 16, which amplifier employs a second pair of NPN type transistors.

The output signals from buffer-amplifier 16 are applied to a low gain differential amplifier 18 which also functions as a buffer stage. That is, amplifier 18 employs a second pair of PNP type transistors. The gain of amplifier 18 is approximately 10 and thus the three stages of amplification of the present invention provide a gain of approximately 1,000,000. Amplifier 18 has a single output terminal. Between this output terminal and ground is connected a lag circuit 20.

The output signal from amplifier 18 is applied to an emitter-follower output stage 22. Output stage 22 comprises an emitter-follower amplifier 24 which is biased for class A operation. Emitter follower 24 drives a pair of class B emitter-follower amplifiers 26 and 28. As will be explained in greater detail below, amplifiers 26 and 28 respectively respond only to positive and negative signals from amplifier 24. The positive and negative output signals respectively provided by amplifiers 26 and 28 are applied to an output terminal 30. A second output terminal 30 is grounded. Accordingly, an output signal which swings both positively and negatively with respect to ground may be measured across output terminal 30.

Figure 1:
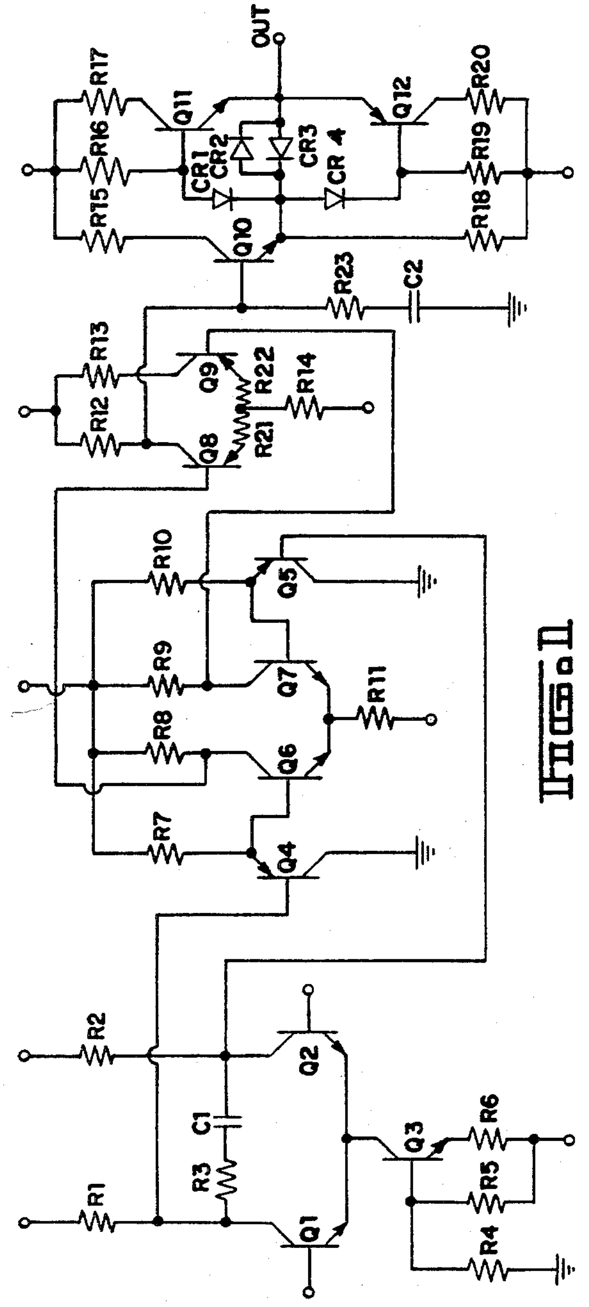
FIGURE 1 is a schematic diagram of a preferred embodiment of the amplifier of the present invention.

Before considering the schematic diagram of FIGURE 1, it should be noted that the present invention is particularly well suited for packaging in the manner disclosed in U.S. Patent No. 3,243,661, issued Mar. 29, 1966, to L. R. Ullery, Jr., and assigned to the same assignee as the present invention. The packaging method of the aforementioned Ullery patent results in the amplifier being disposed within an all welded, evacuated, hermetically sealed package. Since all the components of the amplifier are thus located within the same environment, changes in operating conditions will affect all components in the same manner and thus a large measure of temperature compensation is achieved.

Considering now FIGURE 1, the input stage differential amplifier comprises a matched pair of NPN type transistors Q1 and Q2. The gains of transistors Q1 and Q2 must be matched within 15 percent and preferably are matched within 10 percent. In practice, it has been found that the gain of transistors Q1 and Q2 should be as high as possible, $\beta$'s of 150 to 300 being in the preferred range. Matching of transistors Q1 and Q2 provides both good temperature stability and common mode rejection. Temperature stability is also enhanced by providing a matched pair of collector resistors R1 and R2 which are respectively connected to the collectors of transistors Q1 and Q2. The temperature coefficients of resistors R1 and R2 must track. This tracking is achieved by employing thin film resistors which are deposited on the same substrate.

Current drive for the first stage differential amplifier is provided by connecting the emitter electrodes of transistors Q1 and Q2 to a constant current source comprised of transistor Q3 and resistors R4, R5, and R6. Constant current source Q3 maintains constant current at the collectors of transistors Q1 and Q2. Transistor Q3 also provides a high input impedance for the first stage differential amplifier thus further aiding in common mode rejection.

The constant current source and matched collector resistors results in a potential in excess of 10 volts being applied to the collectors of matched transistors Q1 and Q2. Accordingly, input signals of up to $\pm 10$ volts may be applied to the bases of transistors Q1 and Q2 via the input terminals. As previously noted, first stage differential amplifier 12 which comprises transistors Q1 and Q2 has a gain of approximately 1,000.

A lead circuit 14 comprising resistor R3 and capacitor C1 is connected between the collectors of transistors Q1 and Q2. Lead circuit 14, in combination with lag circuit 20 (FIGURE 2), provides internal compensation in order to shape the gain-bandwidth curve of the equipment so that it never exceeds a slope of 6 db per octave over the operating frequency range.

The opposite polarity output signals from the collector electrodes of transistors Q1 and Q2 are respectively applied to the base electrodes of transistors Q4 and Q5. Transistors Q4 and Q5 in combination with a second pair of transistors Q6 and Q7 comprise buffer-amplifier stage 16. The buffer portion of buffer amplifier stage 16, comprising a first differential amplifier having transistors Q4 and Q5 which are of the opposite conductivity type from transistors Q1 and Q2 and transistors Q6 and Q7, isolates the input differential amplifier comprised of transistors Q1 and Q2 from the differential amplifier comprised of transistors Q6 and Q7. This isolation reduces the effect of gain loss due to loading of the collectors of transistors Q1 and Q2 by the second stage as a function of gain changes in transistors Q6 and Q7. This isolation thus provides temperature compensation by improving the gain stability of the apparatus over the temperature range and from amplifier to amplifier. Restated, PNP type transistors Q4 and Q5 isolate the differential amplifier comprised of NPN transistors Q6 and Q7 from the differential amplifier comprising NPN transistors Q1 and Q2.

Transistors Q4 and Q5, being PNP type devices, also prevent latch up or flip flop action when the amplifier is overdriven. If NPN type devices were used in the buffer stage, latch up would occur since the emitters could be driven negative thus cutting off transistors Q6 or Q7. If transistors Q6 or Q7 were driven to cut off, the circuit would remain in that state, even after signal removal, until the power was interrupted.

The use of PNP type devices for transistors Q4 and Q5 further facilitates construction since the devices can be fabricated from a single chip of silicon keeping the collectors common. This is possible since, as may be seen from FIGURE 1, both collectors are grounded in the circuit. Use of a single chip also precipitates the additional advantage of providing matched devices at almost no additional cost thus further enhancing the temperature stability of the circuit.

The opposite polarity output signals from the collectors of transistors Q6 and Q7 provide drive to the third stage differential amplifier 18 which comprises a second pair of PNP type devices Q8 and Q9. The switching of conductivity type in the third stage differential amplifier is both in the interest of temperature stability and also to provide isolation between the previous stages of amplification and the output stage. Thus, the differential amplifier 18 comprised of transistors Q8 and Q9 functions both as a low gain amplifier and a buffer. It is to be noted that the third stage differential amplifier is a high level unit, the collectors of transistors Q8 and Q9 swinging in excess of $\pm 10$ volts.

The single output signal from the third stage differential amplifier is taken off the collector of transistor Q8 and applied to the base of emitter follower transistor Q10 in output stage 22. Connected between the base of transistor Q10 and ground is a lag network comprising resistor R23 and capacitor C2. As noted above, the lag circuit cooperates with lead circuit 14 (FIGURE 2) to shape the gain-bandwidth curve of the amplifier.

Emitter follower Q10 is biased so that with no input signal to the circuit its emitter is at zero volts. It should also be noted that emitter follower Q10 provides additional isolation between the amplifier stages and the output and that transistor Q10 is protected when the output is shorted. This short circuit protection is achieved by sizing the collector resistances R17 and R20 respectively of emittter followers Q11 and Q12 so that the output drive is dropped to a safe level when short circuit current is drawn.

The final portion of the output stage comprises a pair of emitter followers Q11 and Q12. Emitter followers Q11 and Q12 are respectively biased slightly on by diodes CR1 and CR4 when the emitter of transistor Q10 is at zero volts. When the emitter of transistor Q10 swings positive, emitter follower Q12 is cut off and Q11 delivers the load current. Conversely, a negative swing cuts off Q11 and Q12 delivers the load current. Diodes CR1 and CR4 also temperature compensate the base-emitter junctions of emitter followers Q11 and Q12 and, in combination with diodes CR2 and CR3, provide short circuit protection for the emitter-base junctions. The provision of short circuit protection coupled with the class B operation of the output emitter followers Q11 and Q12 keeps the output impedance both low and constant for positive and negative signals. This is in contrast to the usual result with prior art class A type emitter-follower output stages.

The circuit shown in FIGURE 1 may be constructed utilizing the following components:

Q1 and Q2—matched pair of 2N930A NPN type transistors
Q3, Q6, Q7, Q10 and Q11—2N930A NPN type transistors
Q4, Q5, Q8, Q9 and Q12—2N2605 PNP type transistors
CR1, CR2, CR3 and CR4—IN914
R1 and R2—125K thin film resistors (on same substrate)
R3—45 ohms
R4—24K
R5—16K
R6—57K
R7 and R10—125K
R8 and R9—5K
R11—20K
R12 and R13—50K
R14—3.8K
R15—2.4K
R16 and R19—39K
R17 and R20—320 ohms
R18—12K
R21 and R22—1K
C1—0.08 $\mu$f.
C2—.002 $\mu$f.

A reduction to practice of the embodiment of the present invention depicted in FIGURE 1, using the components listed above, was characterized by a gain of 1 million (120 db) and a drift of 50 microvolts over a 60 day period. The temperature stability was such that the voltage drift was less than 1 microvolt per degree Fahrenheit and the current drift was less than 0.1 nano amps per degree Fahrenheit. The gain-bandwidth was approximately 1 megacycle. The power dissipation of the amplifier was 0.36 watt at full output ($\pm$10 volts at 5 ma.). The common mode limit was 10 volts.

As may be seen from the foregoing description, a novel operational amplifier having desirable operating characteristics has been invented. By means of driving the pair of class B emitter followers at the output stage, both positive and negative output signals having the same impedance relationship may be obtained. Also in the output stage, the amplifier is short circuit protected. The novel amplifier of the present invention is also characterized by extremely low drift (high temperature stability) as well as the ability to be driven by high level input signals.

While a preferred embodiment of this invention has been shown and described, various modifications and substitutions may be made without deviating from the spirit and scope of this invention. Thus, it is to be understood that this invention has been described by way of illustration rather than limitation.

What is claimed is:

1. An operational amplifier comprising:

first differential amplifier means, said first amplifier means including a first pair of transistors of a first conductivity type, opposite polarity input signals being applied to drive said first pair of transistors, said first amplifier means providing at the collectors of said first pair of transistors a pair of output signals;

buffer-amplifier means, said buffer-amplifier means having second and third differential amplifier means respectively including second and third pairs of transistors, the bases of the transistors of said second pair being respectively coupled to collectors of the transistors of said first pair whereby said buffer-amplifier is driven by the output signals from said first differential amplifier means, said transistors of said third pair being of said first conductivity type and those of said second pair being of a second conductivity type to provide isolation between said first and third amplifier means, said second amplifier means being coupled to said third amplifier means and providing a pair of signals each of which signals drives a transistor of said third pair, said third amplifier means providing a pair of output signals;

fourth differential amplifier means having its inputs connected to said third amplifier means, said fourth amplifier means including a fourth pair of transistors, the transistors of said fourth pair being of said second conductivity type and being driven by the output signals provided by said third amplifier means, said fourth differential amplifier means combining said third amplifier means output signals into a single output signal;

first and second emitter follower amplifiers, said emitter follower amplifiers having a common output connection;

a third emitter follower connected to the output of said fourth differential amplifier means and being responsive to said angle output signal provided thereby; and diode means connected between the bases of said first and second emitter followers and the emitter of said third emitter follower, said diode means being poled so as to permit application of only positive polarity signals to said first emitter follower and only negative polarity signals to said second emitter follower.

2. The apparatus of claim 1 wherein said first differential amplifier further comprises:

a constant current source connected to the emitters of said first pair of transistors; and first and second collector resistors respectively connected to the collector electrodes of said transistors of said first pair, the temperature coefficients of said collector resistors being matched.

3. The apparatus of claim 1 wherein said second differential amplifier means comprises:

a pair of PNP type transistors, the collectors of said transistors being grounded, each of the output signals from said first amplifier means being applied to the base of a respective one of said PNP transistors.

4. The apaparatus of claim 2 wherein said second differential amplifier means comprises:

a pair of PNP type transistors, the collectors of said transistors being grounded, each of the output signals from said first amplifier means being applied to the base of a respective one of said PNP transistors.

5. An operational amplifier comprising:

first differential amplifier means, said first amplifier means including a first pair of transistors of a first conductivity type, opposite polarity input signals being applied to drive said first pair of transistors, said first amplifier means providing a pair of output signals at the collectors of said first pair of transistors;

buffer-amplifier means, said buffer-amplifier means having second and third differential amplifier means respectively including second and third pairs of transistors, the transistors of said second pair being of a second conductivity type to provide isolation between said first and third amplifier means, said second amplifier means providing a pair of signals each of which drives a transistor of said third pair, said third amplifier means providing a pair of output signals;

first and second emitter follower amplifiers, said emitter follower amplifiers having a common output connection;

means connected to said buffer-amplifier means and responsive to said pair of third amplifier means output signals for combining said signals into a single output signal;

a third emitter follower amplifier connected to said signal combining means and responsive to the single output signal provided thereby;

diode means connected between the bases of said first and second emitter followers and the emitter of said third emitter followers, said diode means being poled so as to cause application of opposite polarity signals to said first and second emitter followers;

a lead circuit connected across the output of said first differential amplifier means; and a lag circuit connected across the output of said signal combining means.

References Cited

UNITED STATES PATENTS

| | | | |
|---|---|---|---|
| 3,077,566 | 2/1963 | Vosteen | 330—69 X |
| 3,290,520 | 12/1966 | Wennik | 330—69 X |
| 3,363,191 | 1/1968 | Boughtwood et al. | 330—17 |
| 3,364,434 | 1/1968 | Widlar | 330—30 X |
| 3,153,203 | 10/1964 | Sem-Jacobsen et al. | 330—30 |
| 3,262,064 | 7/1966 | Hilbiber | 330—23 |

OTHER REFERENCES

"IC Operational Amplifier," The Electronic Engineer, September 1966, p. 103.

"RCA Low Cost Op Amps Go High Voltage," Electronics, vol. 39, No. 19, p. 38A. Sept. 19, 1966.

ROY LAKE, Primary Examiner

L. J. DAHL, Assistant Examiner

U.S. Cl. X.R.

330—30

PO-1050 (5/69)

UNITED STATES PATENT OFFICE
CERTIFICATE OF CORRECTION

Patent No. 3,471,794 Dated October 7, 1969

Inventor(s) Louis M. Gugliotti, Jr.

It is certified that error appears in the above-identified patent and that said Letters Patent are hereby corrected as shown below:

First paragraph, amend Claim 1 as follows:
Column 6, line 37, change "angle" to --single--
Add the following additional claims:

CLAIM 6. The apparatus of Claim 1 further comprising:
a lead circuit connected across the output of said first differential amplifier means; and
a lag circuit connected across the output of said signal combining means.

CLAIM 7. The apparatus of Claim 2 further comprising:
a lead circuit connected across the output of said first differential amplifier means; and
a lag circuit connected across the output of said signal combining means.

CLAIM 8. The apparatus of Claim 3 further comprising:
a lead circuit connected across the output of said first differential amplifier means; and
a lag circuit connected across the output of said signal combining means.

In the heading to the printed specification, line 9, "5 Claims" should read -- 8 Claims --.

SIGNED AND SEALED
MAY 19 1970

(SEAL)
Attest:

Edward M. Fletcher, Jr.
Attesting Officer

WILLIAM E. SCHUYLER, JR.
Commissioner of Patents